United States Patent
Ishikawa

(10) Patent No.: US 7,259,698 B2
(45) Date of Patent: Aug. 21, 2007

(54) DATA ENCODING APPARATUS, DATA ENCODING METHOD, AND RECORDING MEDIUM RECORDED WITH PROGRAM

(75) Inventor: Takashi Ishikawa, Hachioji (JP)

(73) Assignee: Olympus Imaging Corp., Tokyo (JP)

( * ) Notice: Subject to any disclaimer, the term of this patent is extended or adjusted under 35 U.S.C. 154(b) by 0 days.

(21) Appl. No.: 11/443,427

(22) Filed: May 30, 2006

(65) Prior Publication Data
US 2006/0273937 A1 Dec. 7, 2006

(30) Foreign Application Priority Data
Jun. 1, 2005 (JP) .............................. 2005-161729

(51) Int. Cl.
*H03M 5/00* (2006.01)
(52) U.S. Cl. ........................................ 341/58; 382/232
(58) Field of Classification Search .................. 341/58, 341/59; 382/232, 263; 714/726, 800; 375/219; 704/500; 345/600, 629
See application file for complete search history.

(56) References Cited

U.S. PATENT DOCUMENTS

2006/0269147 A1* 11/2006 Shen et al. ................. 382/232

FOREIGN PATENT DOCUMENTS

JP 09-247423 9/1997

* cited by examiner

*Primary Examiner*—Rexford Barnie
*Assistant Examiner*—Joseph Lauture
(74) *Attorney, Agent, or Firm*—Straub and Pokotylo; John C. Pokotylo

(57) ABSTRACT

In a data encoding apparatus, when a prefix length calculation and determination units determine that the code length of a variable length code constituted of continuous bits "0" is equal to or greater than the predetermined maximum prefix length max_prefix during Golomb-Rice encoding of encoding subject data having a fixed length of D bits, second encoding is performed in place of the Golomb-Rice encoding. The second encoding is performed by having a prefix generation unit generate a prefix constituted of continuous bits "0" corresponding to the max_prefix, and having a code generation unit attach the prefix to the upper order bits of the encoding subject data. Furthermore, when a control code such as a restart marker is to be attached, a marker generation unit generates, as the control code, a code constituted of continuous bits "0" by the number which is equal to or greater than the length of (max_prefix+2×D).

8 Claims, 14 Drawing Sheets

FIG.10

| 0x00 | 0x00 | 0x00 | 0x00 | 0x00 | 0x00 |

FIG.13

| | MAXIMUM NUMBER OF CONTINUOUS BITS "0" | |
|---|---|---|
| | UPPER ORDER SIDE | LOWER ORDER SIDE |
| GOLOMB-RICE ENCODING | max_prefix-1 | D |
| SECOND ENCODING | max_prefix+D-1 | D-1 |

FIG.14

| 0x00 | 0x00 | 0x00 | 0x00 | 0x00 | 0x01 |

US 7,259,698 B2

DATA ENCODING APPARATUS, DATA ENCODING METHOD, AND RECORDING MEDIUM RECORDED WITH PROGRAM

This application claims benefit of Japanese Application No. 2005-161729 filed in Japan on Jun. 1, 2005, the contents of which are incorporated by this reference.

BACKGROUND OF THE INVENTION

1. Field of the Invention

This invention relates to a data encoding apparatus, a data encoding method, and a recording medium recorded with a program for encoding fixed length encoding subject data.

2. Description of Related Art

It is generally known that when encoded data are stored at a fixed length and an error occurs during transmission or the like, further data expansion may become impossible.

Hence, international standard encoding methods such as JPEG prescribe a technique of attaching restart markers to the encoded data at appropriate intervals such that even when an error occurs in a part of the data, expansion of the encoded data can be resumed from the position of the subsequent restart marker. An example of this technique is described in Japanese Unexamined Patent Application Publication H9-247423.

By providing restart markers, not only is error resistance enhanced, but it also becomes possible to expand a desired part of the data alone at high speed, and also to expand the parts of the encoded data defined by the restart markers in parallel, leading to a reduction in the processing time.

Conventionally, Golomb-Rice encoding is employed in JPEG-LS and the like. When restart markers are embedded into Golomb-Rice encoded data, it is impossible to determine the presence of a restart marker simply by sequential reading, and therefore offset information indicating the positions of the restart markers must be provided separately. Information having a so-called chain structure, denoted by the byte count from a certain restart marker to the next restart marker or the like, may be used as the offset information. With this technique, even when the data of a certain bit position within the encoded data are rewritten, decoding can be resumed from the position of the subsequent restart marker.

However, with a technique such as that described above, in which restart markers are embedded in Golomb-Rice encoded data as a control code using offset information, the position of the restart marker may deviate from the position indicated by the offset information due to missing data, the attachment of error information, and so on at a point in the data, and hence the position of the restart marker cannot be specified even though the restart marker exists. As a result, it may become impossible to decode the information. Furthermore, since the offset information takes a chain structure, damage to the position information of a certain restart marker causes similar damage to the position information of the subsequent restart markers.

Therefore, the degree of error resistance of a conventional restart marker which can be applied to Golomb-Rice encoding and so on cannot be said to be sufficiently high. For this reason, it is desirable that a technique of attaching restart markers which have a higher degree of error resistance and are not dependent on offset information be developed.

SUMMARY OF THE INVENTION

An object of this invention is to provide a data encoding apparatus, a data encoding method, and a recording medium recorded with a program which are capable of attaching a control code having a high degree of error resistance.

In brief, this invention is a data encoding apparatus adapted to encode encoding subject data having a fixed length of D bits (where D is an integer of 1 or more), comprising: an encoder adapted to generate encoded data comprising at least one bit of either a bit "0" or a bit "1" from the encoding subject data; and control code attaching portion to attach to the encoded data a control code comprising the continuous number of the other of the bit "0" and the bit "1" which is longer than the maximum continuous number of the other of the bit "0" and the bit "1" in two arbitrary continuous encoded data strings.

This invention is also a data encoding method to encode encoding subject data having a fixed length of D bits (where D is an integer of 1 or more), comprising: generating encoded data comprising at least one bit of either a bit "0" or a bit "1" from the encoding subject data; and attaching to the encoded data a control code comprising the continuous number of the other of the bit "0" and the bit "1" which is longer than the maximum continuous number of the other of the bit "0" and the bit "1" in two arbitrary continuous encoded data strings.

This invention is also a recording medium recorded with a program executed by a computer to encode encoding subject data having a fixed length of D bits (where D is an integer of 1 or more), the program comprising the steps of: generating encoded data comprising at least one bit of either a bit "0" or a bit "1" from the encoding subject data; and attaching to the encoded data a control code comprising a continuous number of the other of the bit "0" and the bit "1" which is longer than a maximum continuous number of the other of the bit "0" and the bit "1" in two arbitrary continuous encoded data strings.

The above and other objects, features, and advantages of the invention will become more clearly understood from the following description referring to the accompanying drawings.

BRIEF DESCRIPTION OF THE DRAWINGS

Figure 10:
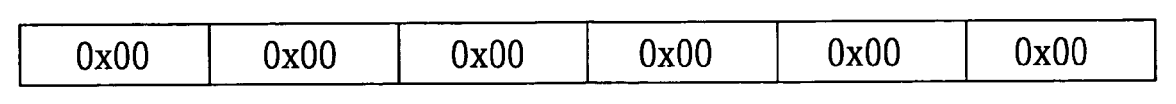

FIG. 10 is a diagram showing the constitution of a restart marker in the first embodiment;

FIG. 13 is a table showing a maximum continuous number of bits "0" on an upper order side and a lower order side during Golomb-Rice encoding and second encoding in the first embodiment;

FIG. 14 is a diagram showing the constitution of a restart marker according to a second embodiment of the present invention;

DETAILED DESCRIPTION OF PREFERRED EMBODIMENTS

Embodiments of the present invention will be described below with reference to the drawings.

First Embodiment

Figure 1:
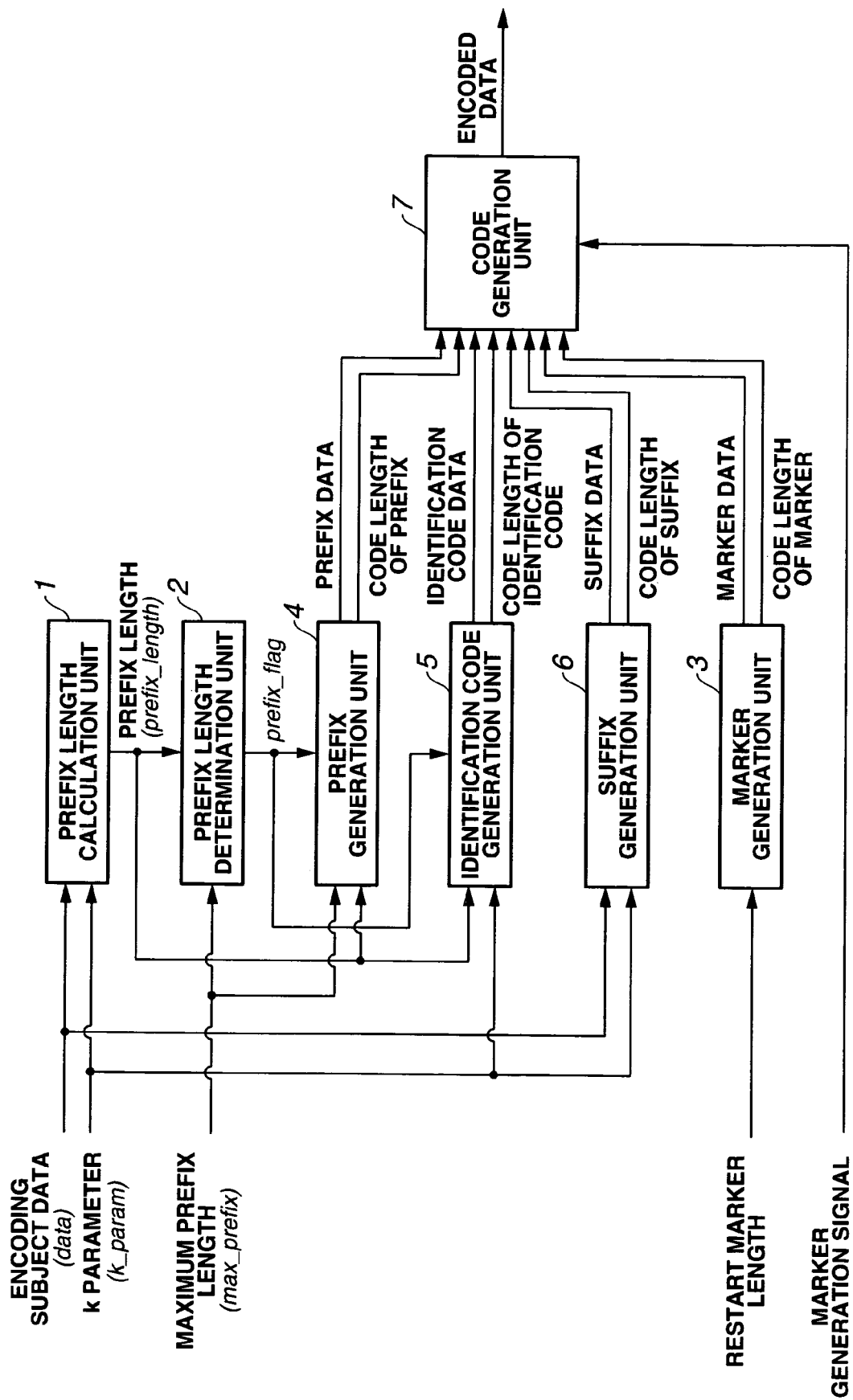
FIG. 1 is a block diagram showing the constitution of a data encoding apparatus according to a first embodiment of the present invention.
Figure 2:
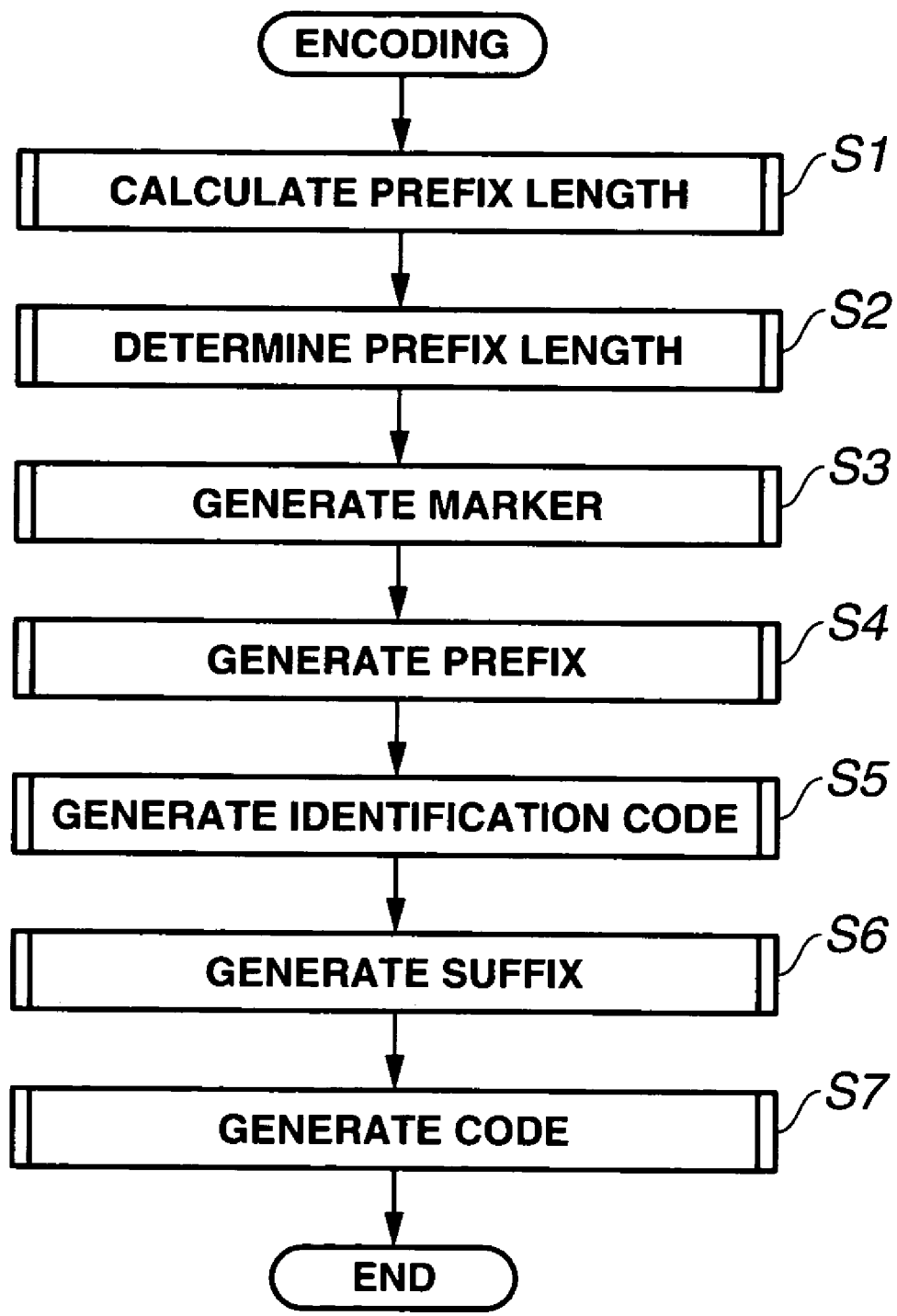
FIG. 2 is a flowchart showing encoding processing in the first embodiment.
Figure 3:
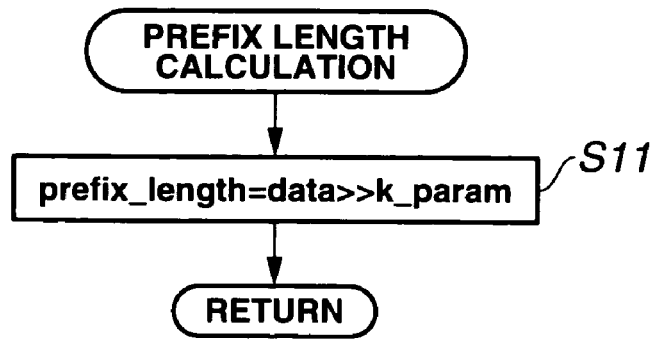
FIG. 3 is a flowchart showing prefix length calculation processing in the first embodiment.
Figure 4:
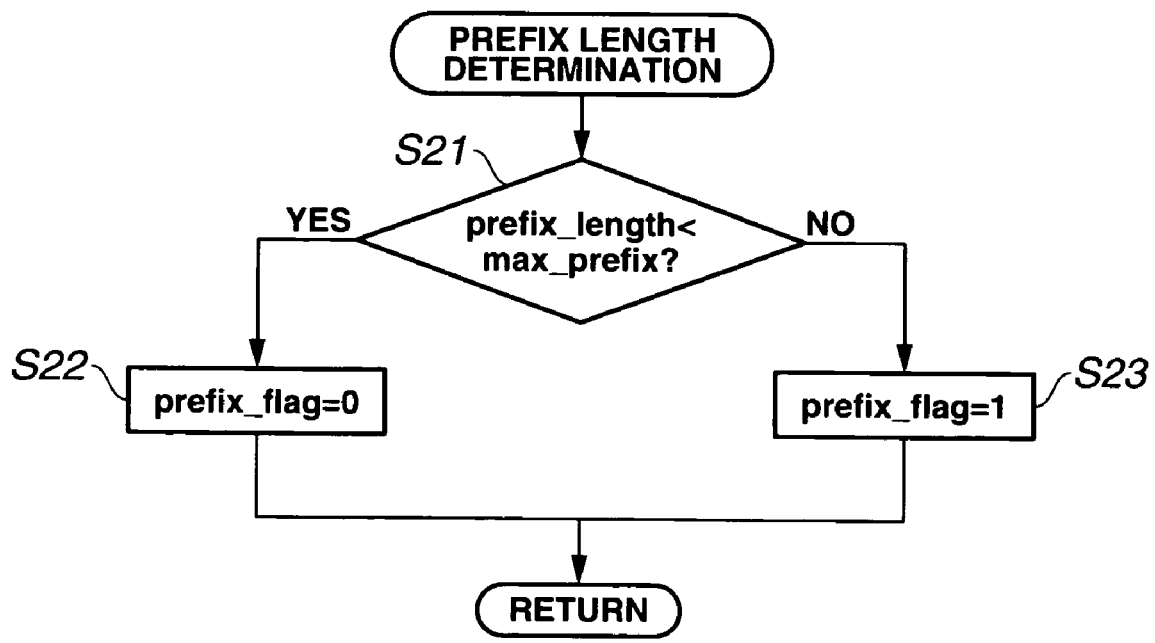
FIG. 4 is a flowchart showing prefix length determination processing in the first embodiment.
Figure 5:
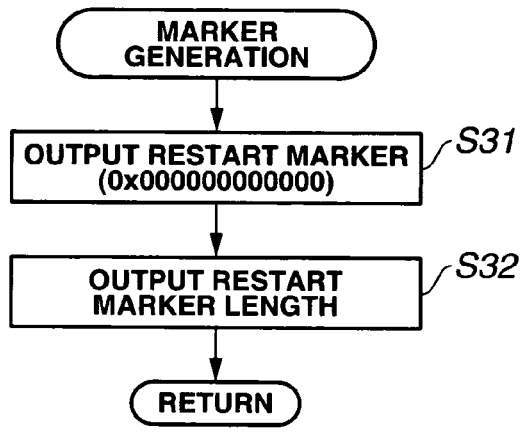
FIG. 5 is a flowchart showing marker generation processing in the first embodiment.
Figure 6:
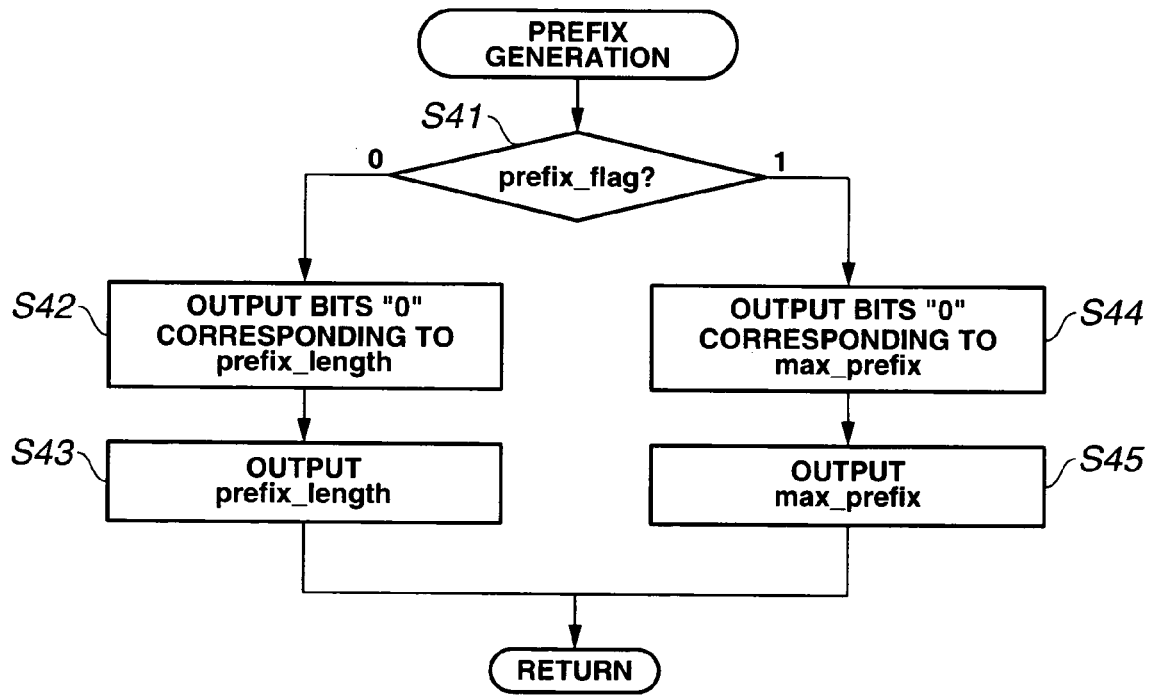
FIG. 6 is a flowchart showing prefix generation processing in the first embodiment.
Figure 7:
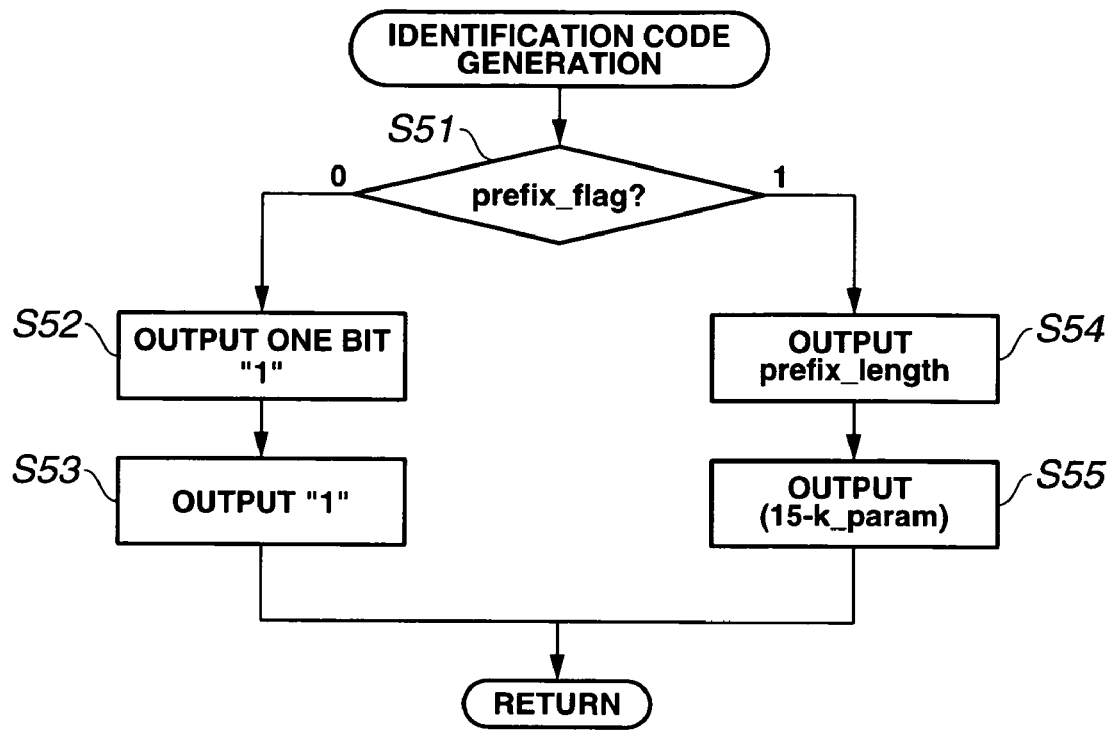
FIG. 7 is a flowchart showing identification code generation processing in the first embodiment.
Figure 8:
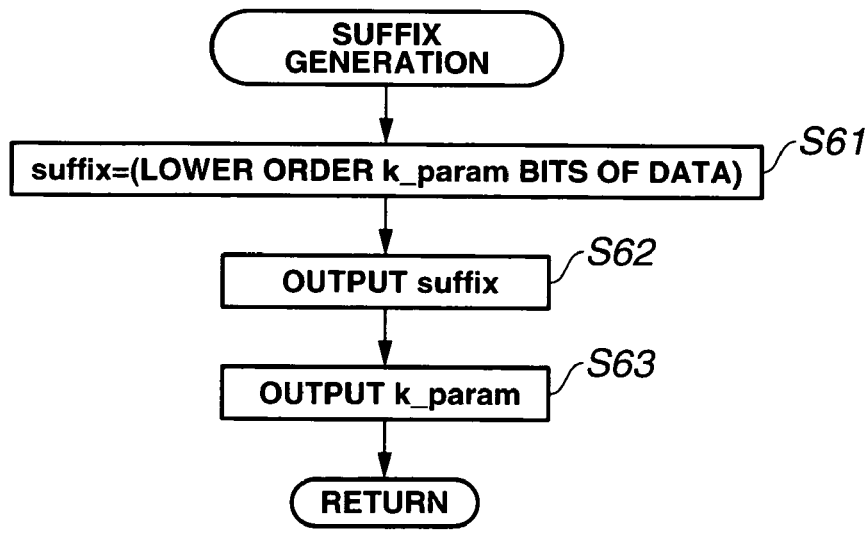
FIG. 8 is a flowchart showing suffix generation processing in the first embodiment.
Figure 9:
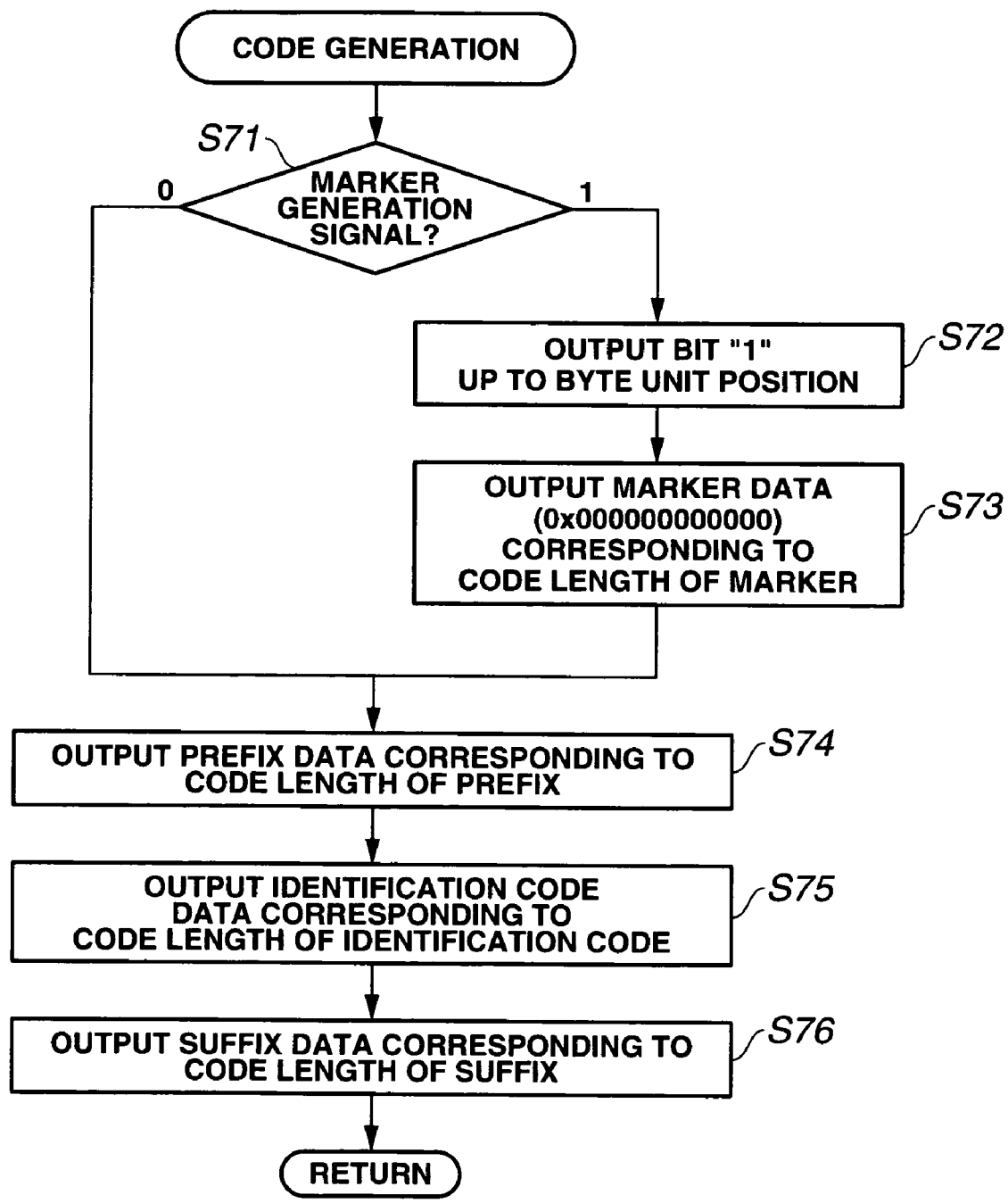
FIG. 9 is a flowchart showing code generation processing in the first embodiment.
Figure 11:
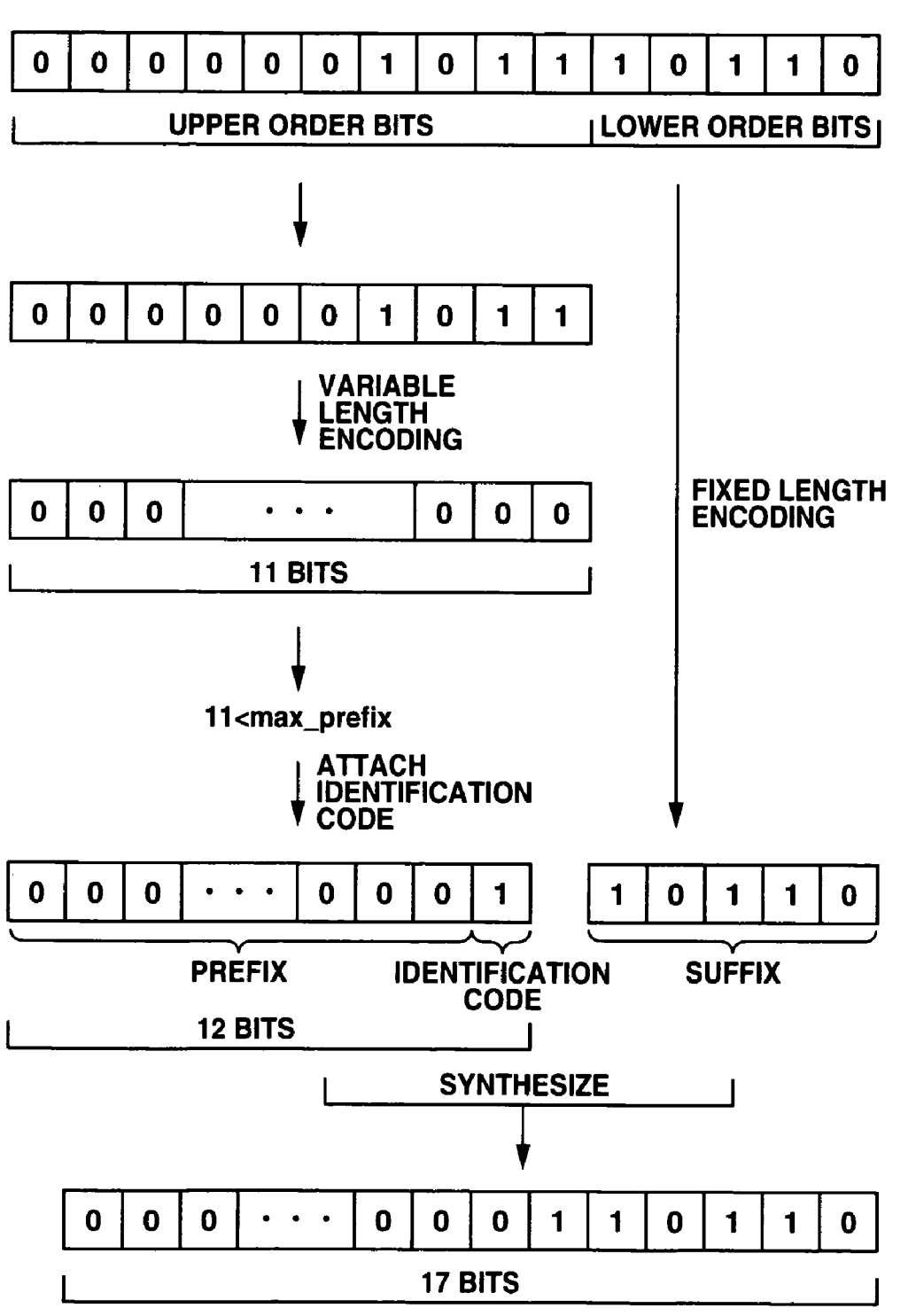
FIG. 11 is a diagram showing an example of encoding in the first embodiment when the value of upper order bits of encoding subject data is smaller than a maximum prefix length.
Figure 12:
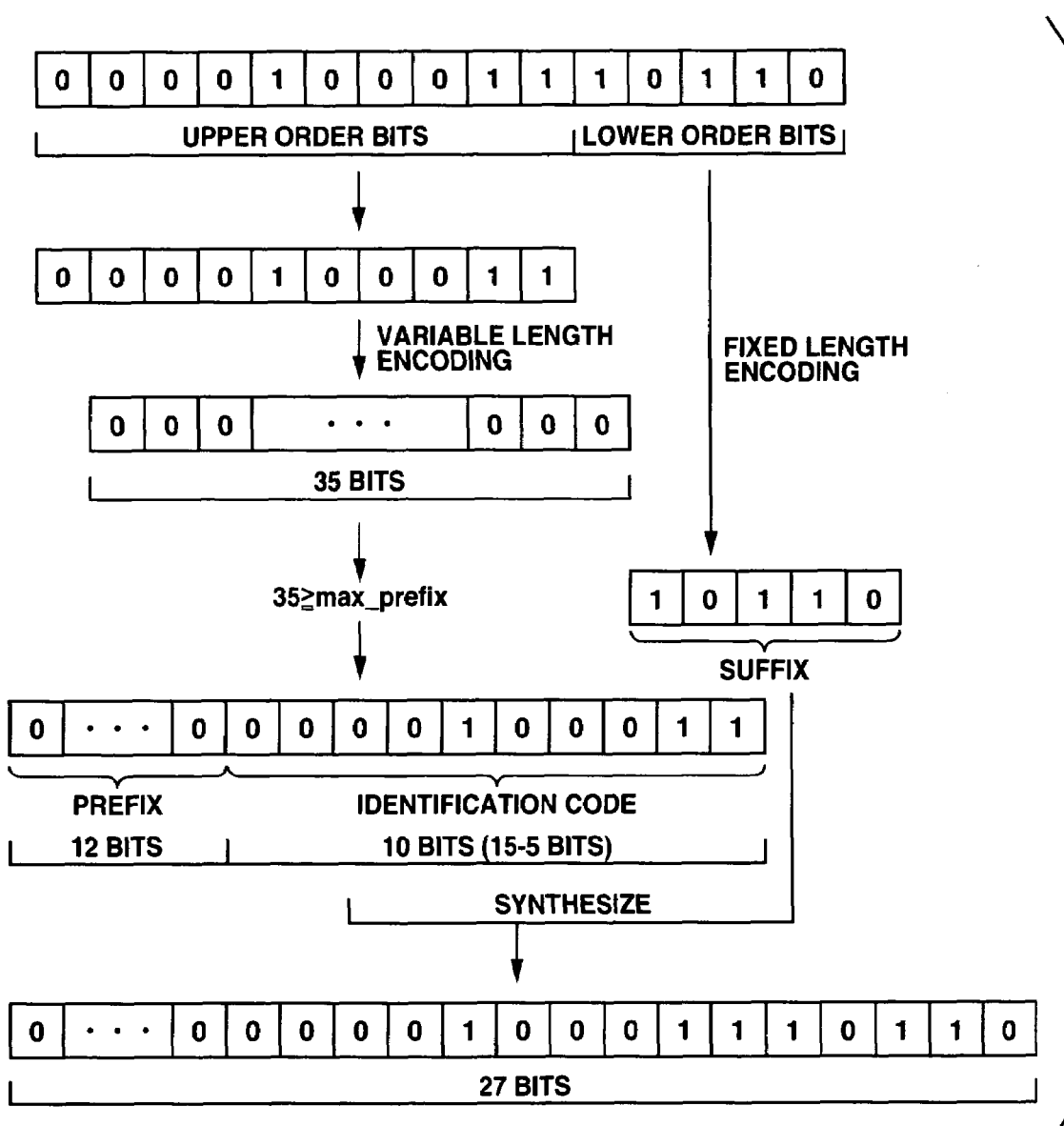
FIG. 12 is a diagram showing an example of encoding in the first embodiment when the value of the upper order bits of the encoding subject data is equal to or greater than the maximum prefix length.

FIGS. 1 through 12 illustrate a first embodiment of the present invention. FIG. 1 is a block diagram showing the constitution of a data encoding apparatus, FIG. 2 is a flowchart showing encoding processing, FIG. 3 is a flowchart showing prefix length calculation processing, FIG. 4 is a flowchart showing prefix length determination processing, FIG. 5 is a flowchart showing marker generation processing, FIG. 6 is a flowchart showing prefix generation processing, FIG. 7 is a flowchart showing identification code generation processing, FIG. 8 is a flowchart showing suffix generation processing, FIG. 9 is a flowchart showing code generation processing, FIG. 10 is a diagram showing the constitution of a restart marker, FIG. 11 is a diagram showing an example of encoding when the value of upper order bits of encoding subject data is smaller than a maximum prefix length, FIG. 12 is a diagram showing an example of encoding when the value of the upper order bits of the encoding subject data is equal to or greater than the maximum prefix length, and FIG. 13 is a table showing a maximum continuous number of bits "0" on an upper order side and a lower order side during Golomb-Rice encoding and second encoding.

First, data to be encoded are assumed to comprise one or more encoding subject data of a fixed length (assumed to be D (where D is an integer of one or more) bits). As a specific example, assuming that the data to be encoded are image data, the encoding subject data are pixel data constituting the image data, for example, and the fixed length D of the pixel data is 8 bits in accordance with the dynamic range of the pixel data, i.e. when the pixel data are constituted by 256 gradations, for example.

The data encoding apparatus performs encoding by means of improved Golomb-Rice encoding to generate encoded data in which a control code such as a restart marker can be identified from the sequentially read encoded data without the use of offset information. As regards the improved Golomb-Rice encoding, the encoding subject data are basically encoded using Golomb-Rice encoding (first encoding), but when the code length according to Golomb-Rice encoding is equal to or greater than a predetermined code length, second encoding to be described below is applied. Further, the code length (bit count) of the fixed length code part obtained during Golomb-Rice encoding is provided in accordance with a k parameter k_param (k_param is an integer satisfying $0 \leq k\_param \leq D$), and hence the fixed length code part of the encoding subject data will be referred to hereafter as lower order bits, while the part of the encoding subject data other than the fixed length code part will be referred to as upper order bits.

As shown in FIG. 1, the data encoding apparatus is constituted of a prefix length calculation unit 1 serving as encoding means, a prefix length determination unit 2 serving as encoding means, a marker generation unit 3 serving as control code attaching means, a prefix generation unit 4 serving as encoding means, an identification code generation unit 5 serving as encoding means, a suffix generation unit 6 serving as encoding means, and a code generation unit 7 serving as encoding means and control code attaching means.

The prefix length calculation unit 1 calculates a prefix length, which is the bit length of a prefix (see FIG. 11) when the upper order bits are subjected to variable length encoding, on the basis of the value of the upper order bits of encoding subject data data.

The prefix length determination unit 2 determines whether or not the prefix length calculated by the prefix length calculation unit 1 is equal to or greater than a predetermined maximum prefix length.

The marker generation unit 3 generates marker data when the encoding subject data data are encoding subject data to which restart markers are to be attached.

The prefix generation unit 4 generates a prefix either through Golomb-Rice encoding or through the second encoding on the basis of the determination result of the prefix length determination unit 2.

The identification code generation unit 5 generates an identification code either through Golomb-Rice encoding or through the second encoding on the basis of the determination result of the prefix length determination unit 2.

The suffix generation unit 6 generates a suffix either through Golomb-Rice encoding or through the second encoding. As will be described below, the aforementioned lower order bit part is used without modification as the suffix regardless of whether Golomb-Rice encoding or the second encoding is employed.

The code generation unit 7 generates encoded data by connecting the marker data generated by the marker generation unit 3 as needed, the prefix generated by the prefix generation unit 4, the identification code generated by the identification code generation unit 5, and the suffix generated by the suffix generation unit 6 in that order, and then outputs the encoded data.

Note that in FIG. 1, the operation timing among blocks is adjusted by a timing adjustment circuit not shown in the drawing.

The data encoding apparatus shown in FIG. 1 will now be described in further detail along the description of the actions.

First, referring to FIG. 2, the flow of encoding processing will be described.

To begin this processing, the prefix length calculation unit 1 calculates a prefix length (step S1).

Next, the prefix length determination unit 2 determines whether or not the prefix length calculated by the prefix length calculation unit 1 is equal to or greater than the predetermined maximum prefix length (step S2).

Next, the marker generation unit 3 generates marker data when a marker generation signal is received (step S3).

The prefix generation unit 4 then generates a prefix corresponding to Golomb-Rice encoding or a prefix corresponding to the second encoding, depending on the determination result of the prefix length determination unit 2 (step S4).

Further, the identification code generation unit 5 generates an identification code corresponding to Golomb-Rice encoding or an identification code corresponding to the second encoding, depending on the determination result of the prefix length determination unit 2 (step S5).

The suffix generation unit 6 then generates a suffix (step S6).

The code generation unit 7 generates encoded data by connecting the prefix, the identification code, the suffix, and if necessary the marker data (step S7), whereupon the routine ends.

Next, referring to FIG. 3, the prefix length calculation processing of the step S1 will be described in detail.

The encoding subject data data and the k parameter k_param are input into the prefix length calculation unit 1. The prefix length calculation unit 1 then subjects the encoding subject data data to a rightward bit shift by the value indicated by the k parameter k_param (in FIG. 3, this is indicated by the symbol "data>>k_param"), and stores the result as the prefix length prefix_length (step S11). The routine then returns to the processing shown in FIG. 2. Note that in the example described here, the bit length (fixed length D) of the encoding subject data data is "15".

Next, referring to FIG. 4, the prefix length determination processing of the step S2 will be described in detail.

The prefix length prefix_length calculated by the prefix length calculation unit 1 and a predetermined maximum prefix length max_prefix (where max_prefix is an integer of 1 or more) are input into the prefix length determination unit 2. The prefix length determination unit 2 determines whether or not the prefix length prefix_length is smaller than the maximum prefix length max_prefix (step S21), and when the prefix length prefix_length is smaller than the maximum prefix length max_prefix, sets a prefix flag prefix_flag to "0" (step S22). On the other hand, when the prefix length prefix_length is equal to or greater than the maximum prefix length max_prefix, the prefix flag prefix_flag is set to "1" (step S23). Once the processing of the step S22 or the step S23 is complete, the routine returns to the processing shown in FIG. 2.

Next, referring to FIG. 5, the marker generation processing of the step S3 will be described in detail.

A predetermined restart marker length is input into the marker generation unit 3. Here, for reasons to be described below, the restart marker length is set at "48". The marker generation unit 3 outputs 48 bits "0" (denoted by the symbol "0x000000000000" (where "0x" indicates a hexadecimal number) in FIG. 5 and FIG. 9 below, and denoted by six "0x00" symbols in FIG. 10) as the restart marker (step S31), and also outputs the restart marker length "48" (step S32). The routine then returns to the processing shown in FIG. 2.

Next, referring to FIG. 6, the prefix generation processing of the step S4 will be described in detail.

The prefix length prefix_length calculated by the prefix length calculation unit 1, the prefix flag prefix_flag output by the prefix length determination unit 2, and the predetermined maximum prefix length max_prefix are input into the prefix generation unit 4. First, the prefix generation unit 4 checks the prefix flag prefix_flag (step S41). When the prefix flag prefix_flag is "0", the prefix generation unit 4 outputs bits "0" by the number corresponding to the prefix length prefix_length (step S42), and outputs the prefix length prefix_length (step S43). On the other hand, when the prefix flag prefix_flag is at "1", the prefix generation unit 4 outputs bits "0" by the number corresponding to the maximum prefix length max_prefix (step S44), and outputs the maximum prefix length max_prefix (step S45). Once the processing of the step S43 or the step S45 is complete, the routine returns to the processing shown in FIG. 2.

Next, referring to FIG. 7, the identification code generation processing of the step S5 will be described in detail.

The prefix length prefix_length calculated by the prefix length calculation unit 1, the prefix flag prefix_flag output by the prefix length determination unit 2, and the k parameter k_param are input into the identification code generation unit 5. First, the identification code generation unit 5 checks the prefix flag prefix_flag (step S51). When the prefix flag prefix_flag is at "0", the identification code generation unit 5 outputs one bit "1" as the identification code (step S52), and outputs "1", indicating the code length of the identification code (step S53). On the other hand, when the prefix flag prefix_flag is at "1", the identification code generation unit 5 outputs the prefix length prefix_length as the identification code (step S54), and outputs "15−k_param", indicating the code length of the identification code (step S55). Once the processing of the step S53 or the step S55 is complete, the routine returns to the processing shown in FIG. 2.

Next, referring to FIG. 8, the suffix generation processing of the step S6 will be described in detail.

The encoding subject data data and the k parameter k_param are input into the suffix generation unit 6. The suffix generation unit 6 sets the lower order k_param bit part of the encoding subject data data as suffix data suffix (step S61), and then outputs the suffix data suffix (step S62) together with the k parameter k_param indicating the code length of the suffix (step S63). The routine then returns to the processing shown in FIG. 2.

Next, referring to FIG. 9, the code generation processing of the step S7 will be described in detail.

The marker data and marker code length are input into the code generation unit 7 from the marker generation unit 3, the prefix data and prefix code length are input into the code generation unit 7 from the prefix generation unit 4, the identification code data and the code length of the identification code are input into the code generation unit 7 from the identification code generation unit 5, the suffix data and suffix code length are input into the code generation unit 7 from the suffix generation unit 6, and where necessary, alarmer generation signal is also input into the code generation unit 7. First, the code generation unit 7 checks the marker generation signal (step S71). When the bit is standing (at "1"), the code generation unit 7 outputs the bit "1" up to a byte unit position in order to perform packing to finalize the data up to the previous pixel in byte units (step S72). Note that here, the bit "1" is output to clarify the starting position of the next marker data (if the starting position of the marker data is clear, the code length of the marker data is known, and hence the end position of the marker data also becomes clear, enabling clarification of the starting position of the following encoded data). Next, the marker data are output in accordance with the marker code length (as described above, 48 bits "0") (step S73). Once the step S73 is complete, or when the marker generation signal is at "0" in the step S71, the prefix data are output in accordance with the prefix code length (step S74). The identification code data are then output in accordance with the code length of the identification code (step S75), whereupon the suffix data are output in accordance with the suffix code length (step S76). The routine then returns to the processing shown in FIG. 2.

Next, referring to FIG. 11, an example of encoding performed when the upper order bit value of the encoding subject data is smaller than the maximum prefix length max_prefix will be described.

As described above, the fixed length D of the encoding subject data data is 15 bits, and in the example described here, the encoding subject data data is expressed as a decimal of "374". It is also assumed that the k parameter k_param is set at "5" and the maximum prefix length max_prefix is set at "12". When expressed as a binary number, the encoding subject data becomes "000000101110110", and hence the upper order bits are "0000001011" and the lower order bits are "10110". Here, the upper order bits are expressed as a decimal of "11", which is smaller than the maximum prefix length max_prefix, and therefore the prefix flag prefix_flag is set to "0". Accordingly, in the step S42, bits "0" are output by the number corresponding to the value of the upper order bits, i.e. "11" (decimal number), as the prefix, and hence "00000000000" is output as the prefix. Also at this time, one bit "1" is output as the identification code. The lower order bits are provided without modification as the suffix. Hence, the code generated by the code generation unit 7 is "00000000000110110", and thus a code having a code length of 17 bits is obtained. Golomb-Rice encoding is performed in this manner when the value of the upper order bits of the encoding subject data data is smaller than the maximum prefix length max_prefix. Note that since the maximum value of the prefix code length is (max_prefix−1), the code length of the identification code is 1, and the suffix code length is k_param, the maximum code length obtained through the application of Golomb-Rice encoding is (max_prefix+k_param).

Next, referring to FIG. 12, an example of encoding performed when the upper order bit value of the encoding subject data data is equal to or greater than the maximum prefix length max_prefix will be described.

In the example described here, the encoding subject data data is expressed as a decimal of "1142". The fixed length D of the encoding subject data data, the value of the k parameter k_param, and the value of the maximum prefix length max_prefix are as described above. When expressed as a binary number, the encoding subject data data become "000010001110110", and hence the upper order bits are "0000100011" and the lower order bits are "10110". Here, the upper order bits are expressed as a decimal of "35", which is greater than the maximum prefix length max_prefix, and therefore the prefix flag prefix_flag is set to "11". Accordingly, in the step S44, bits "0" are output by the number corresponding to the maximum prefix length max_prefix, i.e. "12" (decimal number), as the prefix, and hence "000000000000" is output as the prefix. Also at this time, the prefix length prefix_length "0000100011" (which is identical to the value of the upper order bits) is output as the identification code. The lower order bits are provided without modification as the suffix. Hence, the code generated by the code generation unit 7 is "000000000000000010001110110", and thus a code having a code length of 27 bits is obtained. This is identical to a value obtained by adding the prefix "000000000000" to the unmodified upper order bits of the encoding subject data data. Note that since the prefix code length is max_prefix, and the code length obtained by adding together the identification code and the suffix is the fixed length D of the encoding subject data data irrespective of the value of the k parameter k_param, the code length obtained through application of the second encoding is fixed at (max_prefix+D).

Figure 17:
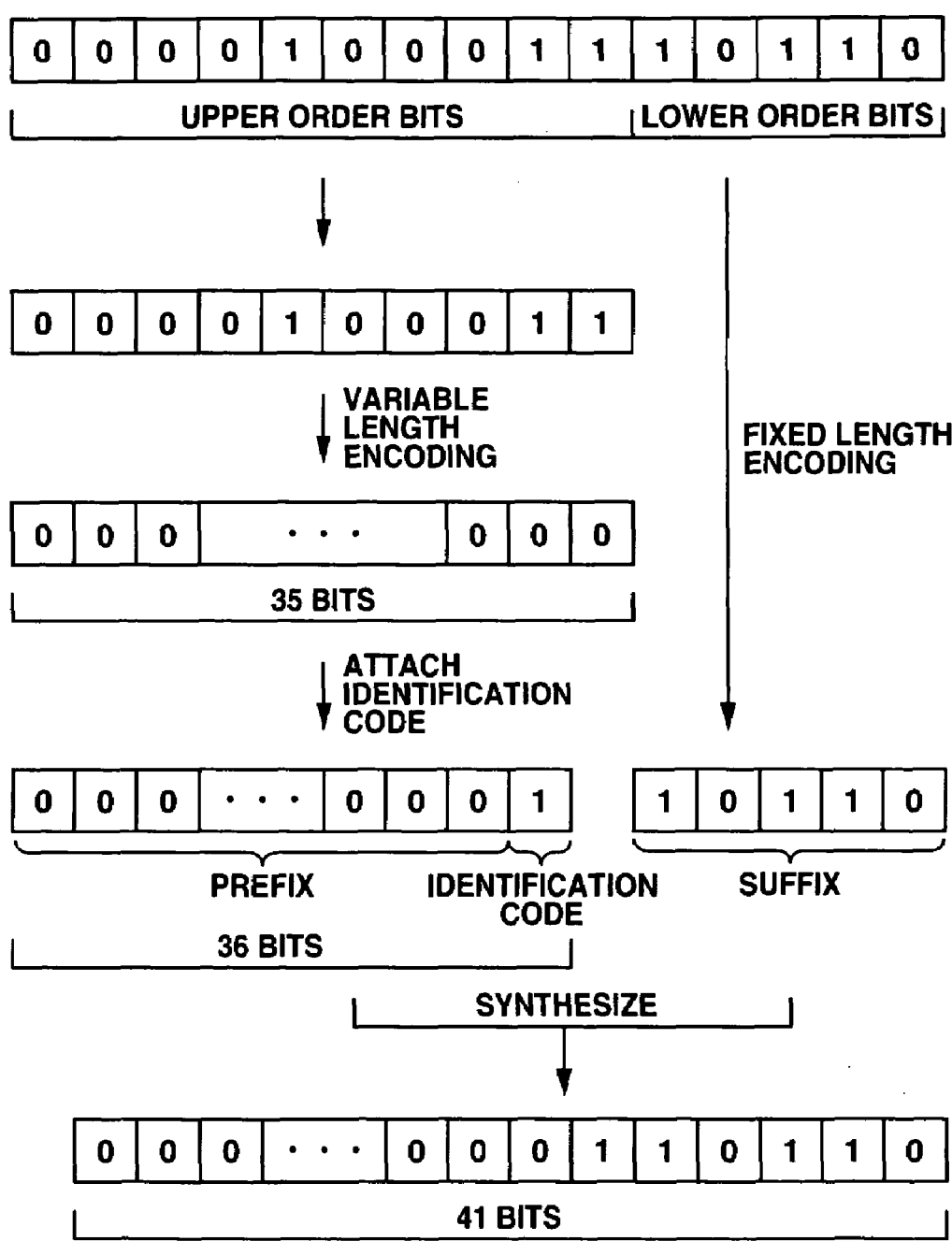
FIG. 17 is a diagram showing an example in which encoding subject data whose upper order bit value is equal to or greater than the maximum prefix length are encoded by conventional Golomb-Rice encoding.

Here, for comparison, a case in which encoding subject data "1142" (decimal number) identical to that of FIG. 12 are subjected to conventional Golomb-Rice encoding will be described with reference to FIG. 17. FIG. 17 is a diagram showing an example in which encoding subject data whose upper order bit value is equal to or greater than the maximum prefix length is encoded by conventional Golomb-Rice encoding.

As described above, the upper order bit value is "35" (decimal number), and hence "000000000000000000000000000000000" is obtained following variable length encoding. Accordingly, following addition of the identification code, addition of the suffix, and synthesis, the encoded data become "00000000000000000000000000000000110110" and have a 41 bit code length. Hence, by restricting the code length of the variable length code using the maximum prefix length max_prefix, as in this embodiment, it is possible to limit increases in the code length when the upper order bit value is large.

Furthermore, by limiting the code length of the variable length code in this manner, the number of continuous bits "0" can be limited as shown in FIG. 13.

First, during Golomb-Rice encoding such as that shown in FIG. 11, the identification code is a bit "1", and therefore the maximum continuous number of bits "0" on the upper order side is equal to the code length of the prefix (max_prefix−1).

Further, the maximum number of continuous bits "0" on the lower order side during Golomb-Rice encoding is identical to the fixed length D of the encoding subject data data. In a specific example, the k parameter k_param is equal to the fixed length D of the encoding subject data data, and the encoding subject data data correspond to 0 (i.e. all of the bits are bits "0"). Hence in this case, D continuous bits "0" follow the single bit identification code "1".

Next, in the case of the second encoding shown in FIG. 12, the maximum number of continuous bits "0" on the upper order side corresponds to (max_prefix+D−1). In a specific example, the k parameter k_param is 0, the maximum prefix length max_prefix is 1, and the encoding subject data data correspond to 1 (i.e. the upper order (D−1) bits are all bits "0" and only the least significant bit is a bit "1"). In this case, the k parameter k_param is 0, and therefore all of the bits are upper order bits and the value of the upper order bits is equal to or greater than the maximum prefix length max_prefix of 1. Accordingly, the second encoding shown in FIG. 12 is applied such that bits "0" corresponding to max_prefix are added to the front of the encoding subject data data as a prefix. As a result, the encoded data comprise continuous bits "0" by the number corresponding to (max_prefix+D−1) on the upper order side, as described above.

The maximum number of continuous bits "0" on the lower order side during the second encoding is (D−1). In the encoding subject data data of a specific example, only the most significant bit is a bit "1", while the remaining (D−1) bits are all bits "0".

In both Golomb-Rice encoding and the second encoding, a bit "1" is always included in the encoded data (more specifically, a bit "1" is always included in the identification code of the encoded data), and therefore continuous bits "0" can only extend over a maximum of two encoded data strings and not over three or more encoded data strings. Either Golomb-Rice encoding or the second encoding may be applied to each encoding subject data string, and hence there are four possible encoding combinations for two continuous encoding subject data strings. First, the larger of a combination of the maximum number of continuous bits "0" on the lower order side of the first encoded data string and the maximum number of continuous bits "0" on the upper order side of the second encoded data string is determined. As is evident from FIG. 13, D is greater than (D−1) as the maximum number of continuous bits "0" on the lower order side. Similarly, (max_prefix+D−1) is greater than (max_prefix−1) as the maximum number of continuous bits "0" on the upper order side. Accordingly, (max_prefix+ 2×D−1) is obtained by combining the two larger values. As described above, k_param≦D, where D is an integer of 1 or more, and hence (max_prefix+2×D−1) is equal to or greater than the maximum code length (max_prefix+k_param) of the Golomb-Rice encoding and equal to or greater than the code length (max_prefix+D) of the second encoding. Therefore, (max_prefix+2×D−1) is greater than the maximum number of continuous bits "0", included in the encoded data obtained by subjecting one encoding subject data string to Golomb-Rice encoding, and greater than the maximum number of continuous bits "0" included in the encoded data obtained by subjecting one encoding subject data string to the second encoding. Thus it is ensured that the maximum number of continuous bits "0" in the improved Golomb-Rice encoding is (max_prefix+2×D−1). In a case such as that described above, where the fixed length D of the encoding subject data data is 15 and the maximum prefix length max_prefix is 12, the maximum number of continuous bits "0" corresponds to 12+2×15−1=41.

For the reasons described above, a control code having the number of continuous bits "0" equal to or greater than the bit count shown in the following Numeral 1 is preferably used as a control code such as a restart marker which is completely identifiable as the encoded data.

max_prefix+2×D   [Numeral 1]

Thus, in the example described above, a control code having 42 or more continuous bits "0" is preferably used.

Note, however, that in practice, a byte-unit control code is preferably employed, and therefore a control code having a number of continuous bits "0" corresponding to a byte, such as that shown in the following Numeral 2, for example, may be used.

[(max_prefix+2×D)/8]+1   [Numeral 2]

Here, the symbol [ ] denotes a floor function (a function providing a maximum integer not exceeding the numeral inside [ ]).

In the above example, [42/8]+1=5+1=6, and hence a code having a number of continuous bits "0" corresponding to 6 bytes (i.e. 48 bits) is used as the restart marker.

According to the first embodiment, the prefix length is restricted during Golomb-Rice encoding, and hence the encoded data can be prevented from increasing excessively when the upper order bit value is large. As a result, increases in the data amount can be suppressed. Furthermore, data not existing within the encoded data are used as a control code, and hence the control code can be identified during sequential reading without the use of an offset address or the like, enabling greater error resistance. Moreover, data not existing within the encoded data are used as a control code even when the k parameter and maximum prefix length are modified to various values, and hence it is possible with this embodiment to respond to adaptive modification of the k parameter and adaptive modification of the maximum prefix length.

Second Embodiment

Figure 14:
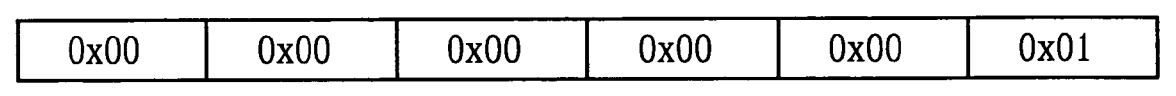
Figure 15:
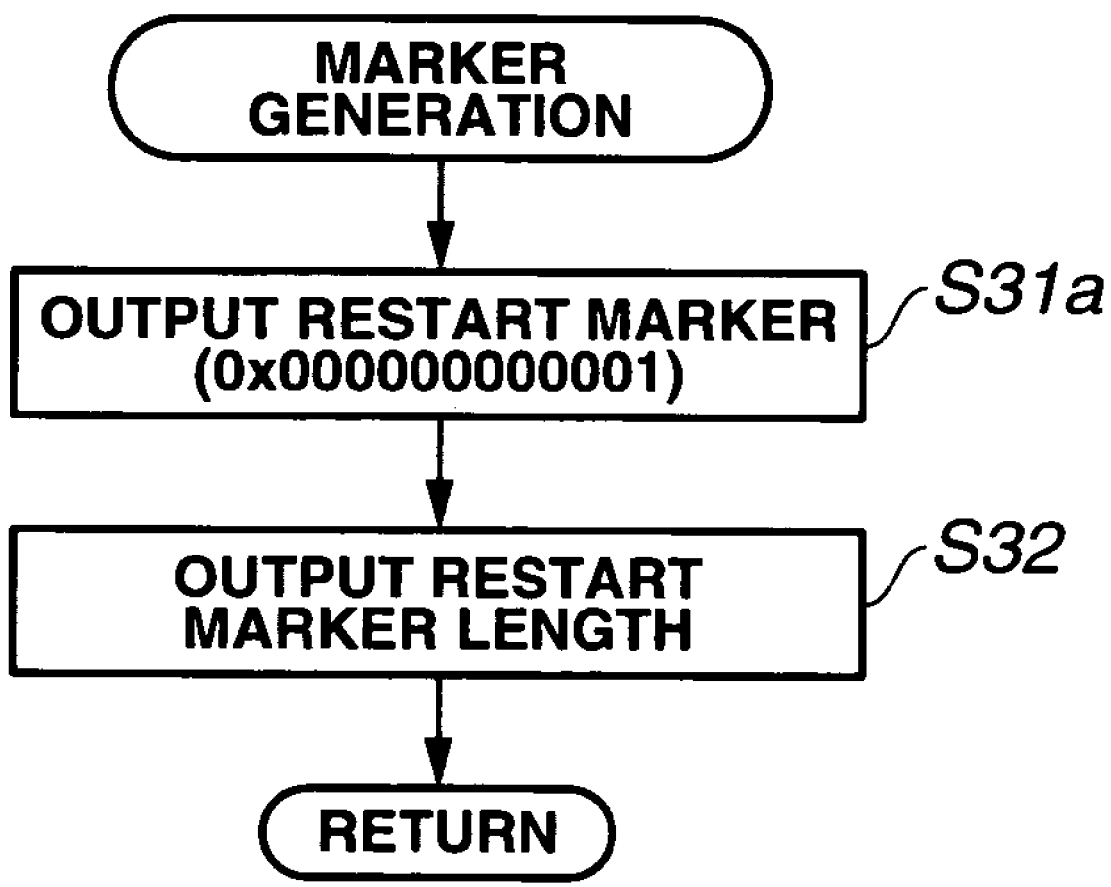
FIG. 15 is a flowchart showing marker generation processing in the second embodiment.
Figure 16:
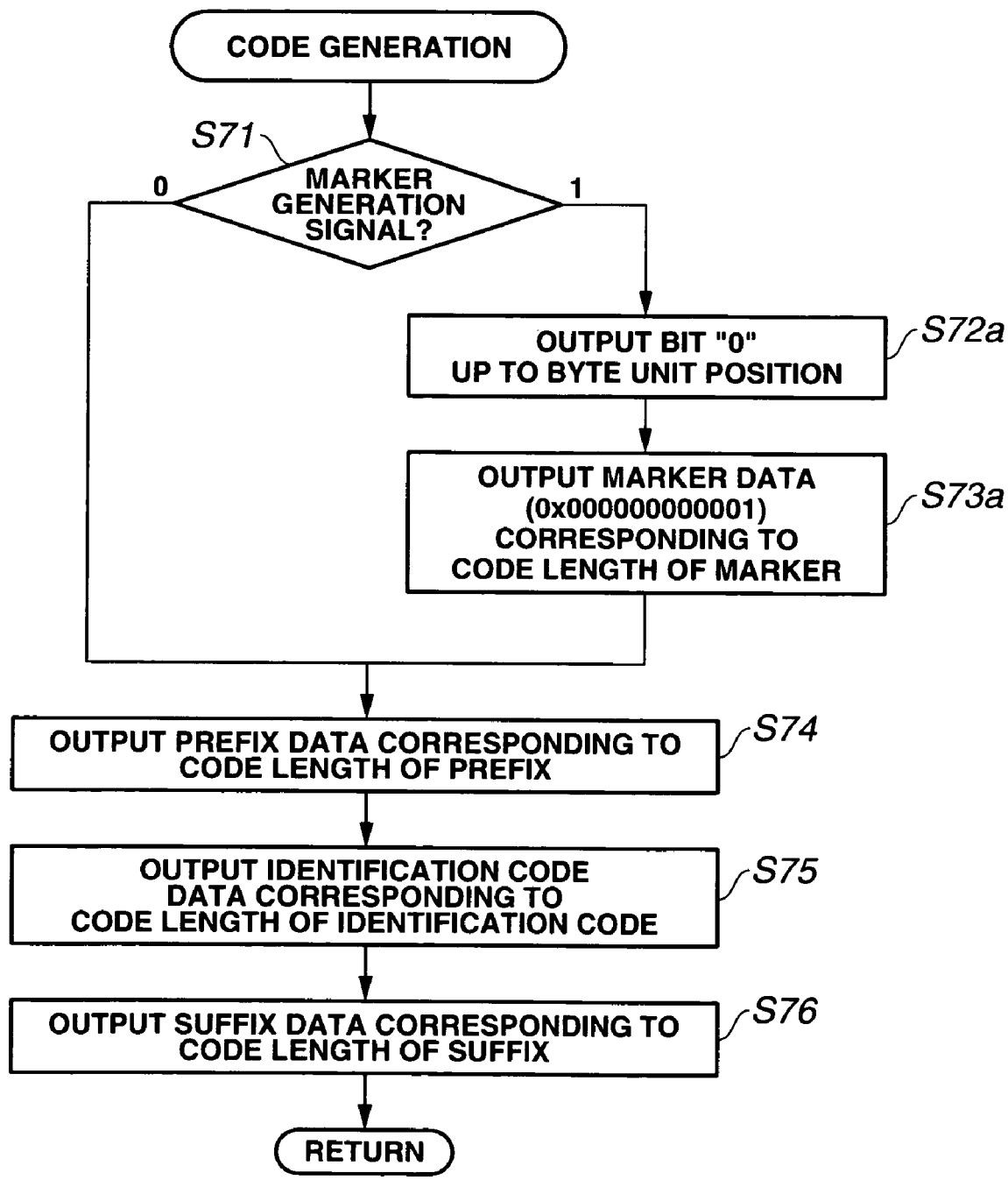
FIG. 16 is a flowchart showing code generation processing in the second embodiment.

FIGS. 14 through 16 illustrate a second embodiment of the present invention. FIG. 14 is a diagram showing the constitution of a restart marker, FIG. 15 is a flowchart showing marker generation processing, and FIG. 16 is a flowchart showing code generation processing.

In the second embodiment, identical reference symbols have been allocated to parts which are identical to those of the first embodiment and description thereof has been omitted. The following description focuses on differing parts.

In the second embodiment, the constitution of the restart marker is slightly altered in order to clarify the end position of the restart marker.

As shown in FIG. 14, the restart marker used in this embodiment is constituted of 48 bits, the 47 upper order bits being 0 (control code) and the least significant bit being 1 (a code indicating the end of the control code). It is assumed in this embodiment also that the fixed length D of the encoding subject data data is 15, the k parameter k_param is 5, and the maximum prefix length max_prefix is 12. More generally, the restart marker is constituted such that the upper order ([max_prefix+2×D]/8]×8+7) bits are 0 (control code) and the least significant bit is 1 (a code indicating the end of the control code). Here, the symbol [ ] denotes a floor function, as above.

The constitution of the data encoding apparatus of the second embodiment is similar to that shown in FIG. 1 and the flow of encoding processing is similar to that shown in FIG. 2.

Referring to FIG. 15, the marker generation processing of the second embodiment, corresponding to the step S3 in FIG. 2, will now be described in detail.

To begin this processing, the marker generation unit 3 outputs 47 bits "0" and one bit "1" as a restart marker (step S31a). The processing of the step S32 described above is then performed, whereupon the routine returns to the processing shown in FIG. 2.

Next, referring to FIG. 16, the code generation processing of the second embodiment, corresponding to the step S7 in FIG. 2, will be described in detail.

When the marker generation signal is determined to be at "1" in the step S71 described above, the bit "0" is output up to a byte unit position in order to perform packing to finalize the data up to the previous pixel in byte units (step S72a). Note that in the processing of the first embodiment shown in FIG. 9, the packing bits must be bits "1" in order to clarify the starting position of the marker data, but with the restart marker of the second embodiment, the end position of the restart marker is clarified as described above, and hence bits "0" may be used as the packing bits. Needless to say, the packing bits may be bits "1", when the restart marker of this embodiment is used.

Next, the marker data are output in accordance with the marker code length (here, 47 bits "0" and one bit "1") (step S73a).

Once the step S73a is complete, or when the marker generation signal is at "0" in the step S71, the processing of the steps S74 to S76 are performed as described above, whereupon the routine returns to the processing shown in FIG. 2.

Note that the code indicating the end of the control code needs only be single bit data having a different bit value to the control code, and is therefore constituted of a single bit in the example described above. However, the code may be constituted of a plurality of bits having a different bit value to the control code.

According to the second embodiment, substantially identical effects to those of the first embodiment are obtained, and in addition, the end position of the restart marker or other control code is clarified, enabling clarification of the starting position of the following encoded data.

Note that in the example described above, the encoding subject data are pixel data constituting image data, but needless to say, the data that can be processed by the data encoding apparatus are not limited thereto.

Furthermore, in the example described above, bits "0" are used as the prefix and control code, but bits "1" may be used instead. In this case, the code indicating the end of the control code and the bit value of the single bit identification code take a different bit value to the prefix and control code.

Moreover, in the example described above, a restart marker is used as the control code, but a control code for use in other applications may be embedded in the encoded data using the technique described above.

Further, in the example described above, processing is performed by a data encoding apparatus, but processing may be performed by applying the data encoding method to a conventional calculator or the like. Alternatively, a program for performing processing equivalent to that performed by the data encoding apparatus may be recorded onto a recording medium, and the program recorded on the recording medium may be executed by a computer.

Having described the preferred embodiments of the invention referring to the accompanying drawings, it should be understood that the present invention is not limited to these precise embodiments and various changes and modifications thereof could be made by one skilled in the art without departing from the spirit or scope of the invention as defined in the appended claims.

What is claimed is:

1. A data encoding apparatus for encoding encoding subject data having a fixed length of D bits (where D is an integer of 1 or more), comprising:
    an encoder adapted to generate encoded data comprising at least one bit of either a bit "0" or a bit "1" from the encoding subject data; and
    control code attaching portion adapted to attach to the encoded data a control code comprising a continuous number of the other of the bit "0" and the bit "1" which is longer than a maximum continuous number of the other of the bit "0" and the bit "1" in two arbitrary continuous encoded data strings.

2. The data encoding apparatus according to claim 1, wherein the encoder is adapted to generate the encoded data by performing first encoding in which the encoding subject data are divided into upper order bits and lower order bits, the upper order bits are encoded into a prefix comprising the continuous number of the other of the bit "0" and the bit "1" corresponding to the value of the upper order bits, the lower order bits being set as a suffix, and one bit of the first of the bit "0" and the bit "1" is added between the upper order side prefix and the lower order side suffix as an identification code.

3. The data encoding apparatus according to claim 2, wherein the encoder is adapted to generate the encoded data using the first encoding when a value of the upper order bits is smaller than a predetermined maximum prefix length max_prefix (where max_prefix is an integer of 1 or more), and generates the encoded data using second encoding when the value of the upper order bits is equal to or greater than the maximum prefix length max_prefix,
    the second encoding being performed by setting the continuous number of the other of the bits "0" and the bits "1" corresponding to the length of the maximum prefix length max_prefix as the prefix, setting the lower order bits as the suffix, and attaching the upper order bits between the upper order side prefix and the lower order side suffix as the identification code, and
    the control code attaching portion adapted to generate the control code by generating the continuous number of the other of the bit "0" and the bit "1" which is equal to or greater than the length of (max_prefix+2×D).

4. The data encoding apparatus according to claim 3, wherein the control code is a restart marker.

5. The data encoding apparatus according to claim 3, wherein the control code attaching portion also attaches a code of one or more bits, in which all of the bit values are constituted of either the bit "0" or the bit "1", to the next to a least significant bit of the control code as a code indicating the end of the control code.

6. The data encoding apparatus according to claim 5, wherein the control code and the code indicating the end of the control code are restart markers.

7. A data encoding method for encoding encoding subject data having a fixed length of D bits (where D is an integer of 1 or more), comprising:
    generating encoded data comprising at least one bit of either a bit "0" or a bit "1" from the encoding subject data; and
    attaching to the encoded data a control code comprising a continuous number of the other of the bit "0" and the bit "1" which is longer than a maximum continuous number of the other of the bit "0" and the bit "1" in two arbitrary continuous encoded data strings.

8. A recording medium recorded with a computer-executable program which, when executed by a computer, encodes encoding subject data having a fixed length of D bits (where D is an integer of 1 or more), by:
    generating encoded data comprising at least one bit of either a bit "0" or a bit "1" from the encoding subject data; and
    attaching to the encoded data a control code comprising a continuous number of the other of the bit "0" and the bit "1" which is longer than a maximum continuous number of the other of the bit "0" and the bit "1" in two arbitrary continuous encoded data strings.

* * * * *